United States Patent
Sugizaki

(10) Patent No.: US 9,761,471 B2
(45) Date of Patent: Sep. 12, 2017

(54) MANUFACTURING LINE FOR SEMICONDUCTOR DEVICE AND METHOD OF MANUFACTURING SEMICONDUCTOR DEVICE

(71) Applicant: TOYOTA JIDOSHA KABUSHIKI KAISHA, Toyota-shi (JP)

(72) Inventor: Daisuke Sugizaki, Nagakute (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 7 days.

(21) Appl. No.: 14/738,122

(22) Filed: Jun. 12, 2015

(65) Prior Publication Data

US 2015/0364353 A1 Dec. 17, 2015

(30) Foreign Application Priority Data

Jun. 17, 2014 (JP) ................. 2014-124768

(51) Int. Cl.
*B65G 43/08* (2006.01)
*H01L 21/00* (2006.01)
*H01L 21/677* (2006.01)
*B65G 47/52* (2006.01)
*H01L 21/67* (2006.01)

(52) U.S. Cl.
CPC ........ *H01L 21/67715* (2013.01); *B65G 43/08* (2013.01); *B65G 47/52* (2013.01); *H01L 21/67276* (2013.01); *H01L 21/67727* (2013.01); *H01L 21/67736* (2013.01); *B65G 2811/0678* (2013.01)

(58) Field of Classification Search
CPC .............................. H01L 21/677; B65G 43/08
USPC .......... 414/222.01, 222.02; 198/340, 341.01, 198/341.03; 700/229, 230
See application file for complete search history.

(56) References Cited

U.S. PATENT DOCUMENTS 5,668,056 A * 9/1997 Wu ................... H01L 21/67017
29/25.01
5,820,679 A 10/1998 Yokoyama et al.
5,963,753 A * 10/1999 Ohtani ................. G03F 7/7075
118/719

(Continued)

FOREIGN PATENT DOCUMENTS

JP 63-255912 A 10/1988
JP 7-115120 A 5/1995

(Continued)

*Primary Examiner* — Douglas Hess
(74) *Attorney, Agent, or Firm* — Oblon, McClelland, Maier & Neustadt, L.L.P.

(57) ABSTRACT

A manufacturing line for a semiconductor device according to the invention is a manufacturing line for manufacturing a semiconductor device by circulating a workpiece along a conveyance route on which a plurality of treatment devices are arranged. The conveyance route includes a first route on which the treatment devices with a large number of times of treatment are arranged, and a second route on which the treatment devices with a small number of times of treatment are arranged. Besides, the conveyance route makes a changeover between the conveyance of the workpiece that has moved along the first route to the first route in a continuous manner, and the conveyance of the workpiece that has moved along the first route to the second route.

13 Claims, 12 Drawing Sheets

(56) References Cited

U.S. PATENT DOCUMENTS

| | | | | |
|---|---|---|---|---|
| 6,235,634 B1* | 5/2001 | White | ............... | H01L 21/67161 118/715 |
| 6,264,748 B1* | 7/2001 | Kuriki | ............... | C23C 16/54 118/715 |
| 6,466,300 B1* | 10/2002 | Deguchi | ............... | H01L 21/67161 118/715 |
| 6,511,315 B2* | 1/2003 | Hashimoto | ............... | G03F 7/7075 118/66 |
| 6,698,944 B2* | 3/2004 | Fujita | ............... | G03F 7/70716 156/345.32 |
| 6,758,647 B2* | 7/2004 | Kaji | ............... | G05B 19/042 414/217 |
| 6,799,910 B2* | 10/2004 | Tateyama | ............... | G03D 3/00 118/52 |
| 7,268,853 B2* | 9/2007 | Ryu | ............... | G03F 7/0012 355/27 |
| 7,319,912 B2* | 1/2008 | Park | ............... | G05B 19/4183 340/572.1 |
| 7,323,060 B2* | 1/2008 | Yamada | ............... | H01L 21/67178 118/319 |
| 7,699,021 B2* | 4/2010 | Volfovski | ............... | G03B 27/32 118/50 |
| 7,758,341 B2* | 7/2010 | Dong-Hun | ............... | H01L 21/67017 219/390 |
| 7,930,061 B2* | 4/2011 | Rice | ............... | H01L 21/67724 414/217 |
| 8,267,634 B2* | 9/2012 | Bufano | ............... | H01L 21/67017 104/281 |
| 8,268,384 B2* | 9/2012 | Matsuoka | ............... | H01L 21/67173 118/52 |
| 8,560,108 B2* | 10/2013 | Matsuyama | ............... | H01L 21/67196 414/222.02 |
| 8,588,950 B2* | 11/2013 | Nomura | ............... | G05B 19/418 414/152 |
| 8,731,701 B2* | 5/2014 | Tsukinoki | ............... | H01L 21/67745 118/719 |
| 9,368,383 B2* | 6/2016 | Ogura | ............... | H01L 21/6715 |
| 2005/0005808 A1 | 1/2005 | Wakabayashi et al. | | |

FOREIGN PATENT DOCUMENTS

| | | |
|---|---|---|
| JP | 2541544 B2 | 10/1996 |
| JP | 11-191582 | 7/1999 |
| JP | 11-214476 A | 8/1999 |
| JP | 2002-100549 | 4/2002 |
| JP | 2003-115425 A | 4/2003 |
| JP | 2012-104683 | 5/2012 |

\* cited by examiner

F I G . 3
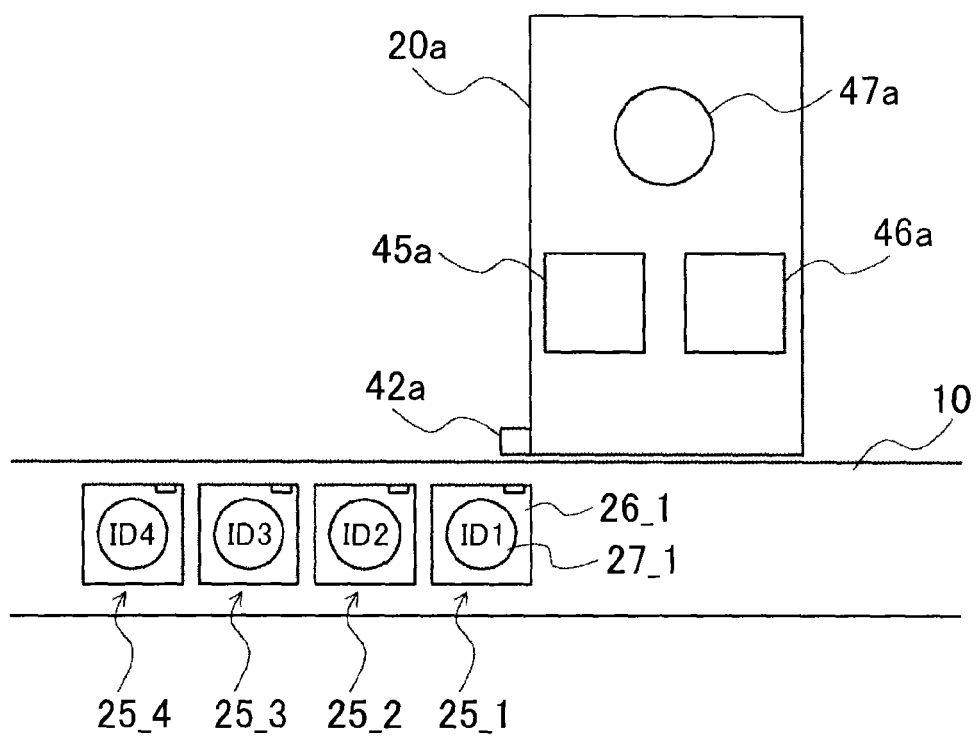

FIG. 6

| PROCESS | PRIORITY LEVEL 1 | PRIORITY LEVEL 2 |
|---|---|---|
| PROCESS 1 | ID3 | |
| PROCESS 9 | | |
| PROCESS 13 | | |
| PROCESS 22 | | |
| PROCESS 29 | | |

FIG. 7

| PROCESS | PRIORITY LEVEL 1 | PRIORITY LEVEL 2 |
|---|---|---|
| PROCESS 1 | ID3 | ID4 |
| PROCESS 9 | | |
| PROCESS 13 | | |
| PROCESS 22 | | |
| PROCESS 29 | | |

FIG.8

| | TREATMENT DEVICE | | | | | | | | | | | | |
|---|---|---|---|---|---|---|---|---|---|---|---|---|---|
| | A | B | C | D | E | F | G | H | I | J | K | L | M |
| PROCESS 1 | ● | | | | | | | | | | | | |
| PROCESS 2 | | ● | | | | | | | | | | | |
| PROCESS 3 | | | | | | ● | | | | | | | |
| PROCESS 4 | | | | | | | ● | | | | | | |
| PROCESS 5 | | | | | | | | ● | | | | | |
| PROCESS 6 | | | | | | | | | ● | | | | |
| PROCESS 7 | | | | | | | | | | | | ● | |
| PROCESS 8 | | | | | | | | | | | | | ● |
| PROCESS 9 | ● | | | | | | | | | | | | |
| PROCESS 10 | | ● | | | | | | | | | | | |
| PROCESS 11 | | | | | | | | | | ● | | | |
| PROCESS 12 | | | | | | | | | | | | | ● |
| PROCESS 13 | ● | | | | | | | | | | | | |
| PROCESS 14 | | | | | ● | | | | | | | | |
| PROCESS 15 | | | | | | | | | | ● | | | |
| PROCESS 16 | | | | | | ● | | | | | | | |
| PROCESS 17 | | | | | | | ● | | | | | | |
| PROCESS 18 | | | | | | | | ● | | | | | |
| PROCESS 19 | | | | | | | | | | | ● | | |
| PROCESS 20 | | | | | | | | | | | | ● | |
| PROCESS 21 | | | | | | | | | | | | | ● |
| PROCESS 22 | ● | | | | | | | | | | | | |
| PROCESS 23 | | | | | | | ● | | | | | | |
| PROCESS 24 | | | | | | | ● | | | | | | |
| PROCESS 25 | | | | | | | | ● | | | | | |
| PROCESS 26 | | | | | | | | | ● | | | | |
| PROCESS 27 | | | | | | | | | | ● | | | |
| PROCESS 28 | | | | | | | | | | | | ● | |
| PROCESS 29 | ● | | | | | | | | | | | | |
| PROCESS 30 | | | | ● | | | | | | | | | |
| PROCESS 31 | | | | | ● | | | | | | | | |
| PROCESS 32 | | ● | | | | | | | | | | | |
| NUMBER OF TIMES | FIVE TIMES | THREE TIMES | ONCE | ONCE | ONCE | THREE TIMES | THREE TIMES | THREE TIMES | TWICE | TWICE | ONCE | THREE TIMES | THREE TIMES |

MANUFACTURING LINE FOR SEMICONDUCTOR DEVICE AND METHOD OF MANUFACTURING SEMICONDUCTOR DEVICE

INCORPORATION BY REFERENCE

The disclosure of Japanese Patent Application No. 2014-124768 filed on Jun. 17, 2014 including the specification, drawings and abstract is incorporated herein by reference in its entirety.

BACKGROUND OF THE INVENTION

1. Field of the Invention

The invention relates to a manufacturing line for a semiconductor device, and a method of manufacturing a semiconductor device.

2. Description of Related Art

A semiconductor device is manufactured by subjecting a semiconductor wafer (a workpiece) to a cleaning treatment, a thermal treatment, a deposition treatment, an etching treatment, an ion implantation treatment and the like through the use of various semiconductor manufacturing installations (treatment devices) that are arranged on a manufacturing line. These treatment devices are aligned on the manufacturing line in such a manner as to correspond to the sequence of processes for the semiconductor device. It should be noted herein that since the same treatment (e.g., a cleaning treatment in forming an oxide film, a cleaning treatment in forming an electrode, or the like) is repeatedly performed in the process of manufacturing the semiconductor device, a plurality of the same treatment devices are arranged on the same manufacturing line. For example, the process for manufacturing the semiconductor device may consist of about 200 processes. The manufacturing line is long when there are many processes as in this case.

Japanese Patent Application Publication No. 2012-104683 (JP 2012-104683 A) discloses an art of manufacturing a semiconductor device by arranging treatment devices on a loop-like conveyance route and causing a workpiece to orbit along this loop-like conveyance route. With the manufacturing line disclosed in Japanese Patent Application Publication No. 2012-104683 (JP 2012-104683 A), the same treatment device that is provided on the manufacturing line can be used in the same treatment in different processes. That is, the treatment devices that are arranged on the manufacturing line can be shared by different processes, so the length of the manufacturing line can be shortened.

As described in the background art, according to the art disclosed in Japanese Patent Application Publication No. 2012-104683 (JP 2012-104683 A), the semiconductor device is manufactured by arranging the treatment devices on the loop-like conveyance route and causing the workpiece to orbit along this loop-like conveyance route. In consequence, the treatment devices that are arranged on the manufacturing line can be shared by different processes, so the length of the manufacturing line can be shortened.

However, with the manufacturing line disclosed in Japanese Patent Application Publication No. 2012-104683 (JP 2012-104683 A), the treatment devices are not aligned in such a manner as to correspond to the sequence of the processes for the semiconductor device, so the treatment device that performs the treatment of the subsequent process is spaced apart from the treatment device that performs the treatment of the current process in some cases. In these cases, while the workpiece is conveyed to the treatment device that performs the treatment of the subsequent process, the workpiece passes in front of the unused treatment devices, so there is a possibility of the conveyance distance of the workpiece being lengthened. For example, when the treatment device that performs the treatment of the subsequent process is adjacent to the other side in the conveyance direction of the workpiece, the workpiece needs to be conveyed by about one turn along the manufacturing line, in order to convey the workpiece to the treatment device that performs the treatment of the subsequent process.

SUMMARY OF THE INVENTION

The invention provides a manufacturing line for a semiconductor device and a method of manufacturing a semiconductor device that allow the conveyance distance of a workpiece to be shortened.

A manufacturing line for a semiconductor device according to one aspect of the invention is a manufacturing line for a semiconductor device for manufacturing the semiconductor device by circulating a workpiece along a conveyance route on which a plurality of treatment devices are arranged. The conveyance route includes a first route on which a plurality of treatment devices that subject the workpiece to predetermined treatments are arranged, and a second route on which a plurality of treatment devices are arranged, the number of times of treatment of the treatment devices that are arranged on the second route being larger than the number of times of treatment of the treatment devices that are arranged on the first route. The conveyance route makes a changeover between conveyance of the workpiece that has moved along the second route to the second route in a continuous manner and conveyance of the workpiece that has moved along the second route to the first route.

A method of manufacturing a semiconductor device according to one aspect of the invention is a method of manufacturing a semiconductor device in which the semiconductor device is manufactured by circulating a workpiece along a conveyance route on which a plurality of treatment devices are arranged. The conveyance route includes a first route on which a plurality of treatment devices that subject the workpiece to predetermined treatments are arranged, and a second route on which a plurality of treatment devices are arranged, the number of times of treatment of the treatment devices that are arranged on the second route being larger than the number of times of treatment of the treatment devices that are arranged on the first route. The semiconductor device is manufactured by making a changeover between conveyance of the workpiece that has moved along the second route to the second route in a continuous manner and conveyance of the workpiece that has moved along the second route to the first route.

In the invention, among the plurality of the treatment devices, the treatment devices with a small number of times of treatment are arranged on the first route, and the treatment devices with a large number of times of treatment are arranged on the second route. Then, there is adopted a configuration in which a changeover can be made between the conveyance of the workpiece that has moved along the second route to the second route in a continuous manner and the conveyance of the workpiece that has moved along the second route to the first route. In consequence, the workpiece can be conveyed to the first route only when being treated by the treatment devices with low frequency. Otherwise, the workpiece can be conveyed to the second route on which the treatment devices with high frequency are arranged. Therefore, the number of times by which the workpiece passes in front of the treatment devices with low frequency can be reduced, so the conveyance distance of the workpiece on the manufacturing line can be shortened.

According to one aspect of the invention, the manufacturing line for the semiconductor device and the method of manufacturing the semiconductor device that allow the conveyance distance of the workpiece to be shortened can be provided.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein:

FIG. 3 is a view for illustrating an example of the operation of the manufacturing line according to the embodiment of the invention;

FIG. 6 is a view showing an example of a table with which a treatment device is equipped;

FIG. 7 is a view showing an example of a table with which a treatment device is equipped;

FIG. 8 is a table showing an example of manufacturing processes of the manufacturing line according to the embodiment of the invention;

DETAILED DESCRIPTION OF EMBODIMENT

Figure 1:
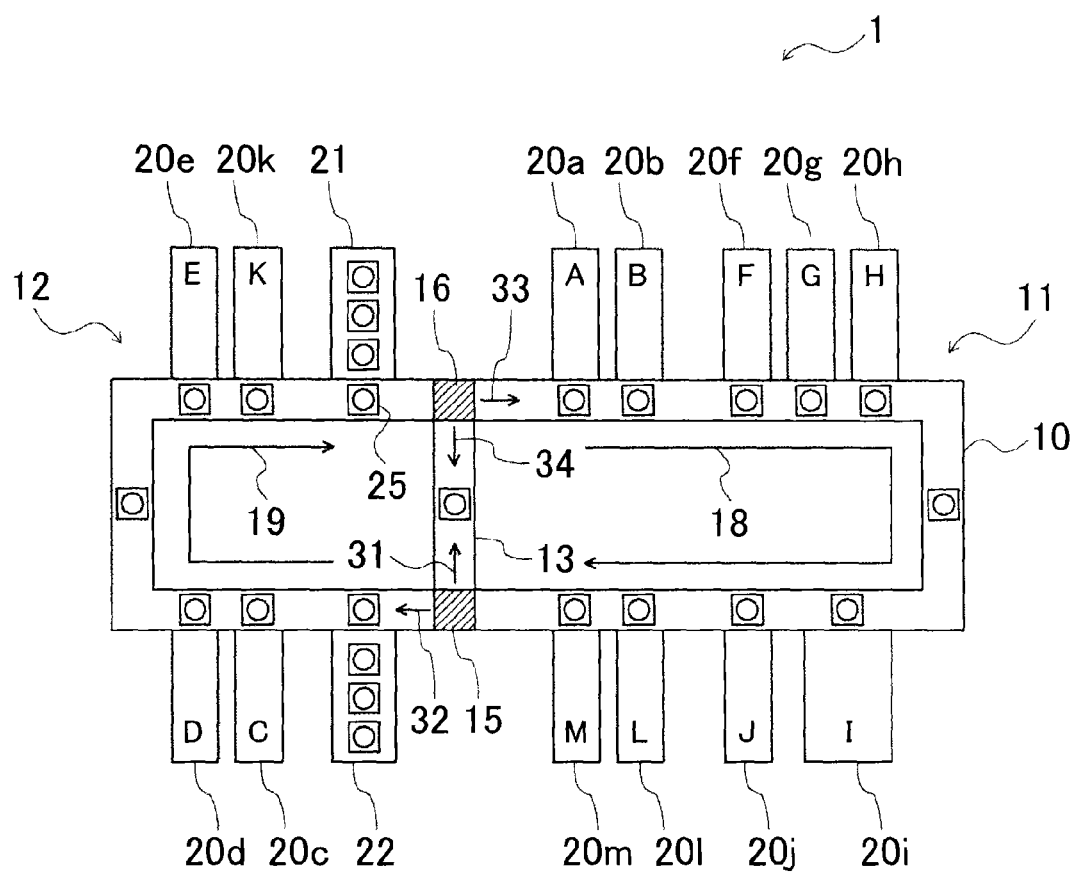
FIG. 1 is a top view of an example of a manufacturing line according to the embodiment of the invention.

The embodiment of the invention will be described hereinafter with reference to the drawings. FIG. 1 is a top view showing an example of a manufacturing line for a semiconductor device according to the embodiment of the invention. As shown in FIG. 1, a manufacturing line 1 according to the present embodiment of the invention includes a conveyance route 10, a plurality of treatment devices 20a to 20m, a carry-in device 21, and a carry-out device 22. The manufacturing line 1 manufactures a predetermined semiconductor device by circulating workpieces 25 along the conveyance route 10 on which the plurality of the treatment devices 20a to 20m are arranged.

The conveyance route 10 includes a route 11, a route 12, and a coupling route 13. The plurality of the treatment devices 20a, 20b, 20f to 20j, 20l, and 20m that subject the workpieces 25 to predetermined treatments are arranged on the route 11. The plurality of the treatment devices 20c, 20d, 20e, and 20k that subject the workpieces 25 to predetermined treatments are arranged on the route 12. It should be noted herein that the predetermined treatments are treatments needed to manufacture a semiconductor device, for example, a cleaning treatment, a thermal treatment, a deposition treatment, an etching treatment, an ion implantation treatment and the like.

Besides, the carry-in device 21 and the carry-out device 22 are arranged on the route 12. The carry-in device 21 brings the workpieces 25 (untreated workpieces) onto the conveyance route 10. Besides, the carry-out device 22 takes out the workpieces 25 (workpieces subjected to all the processes) from the conveyance route 10.

Figure 2:
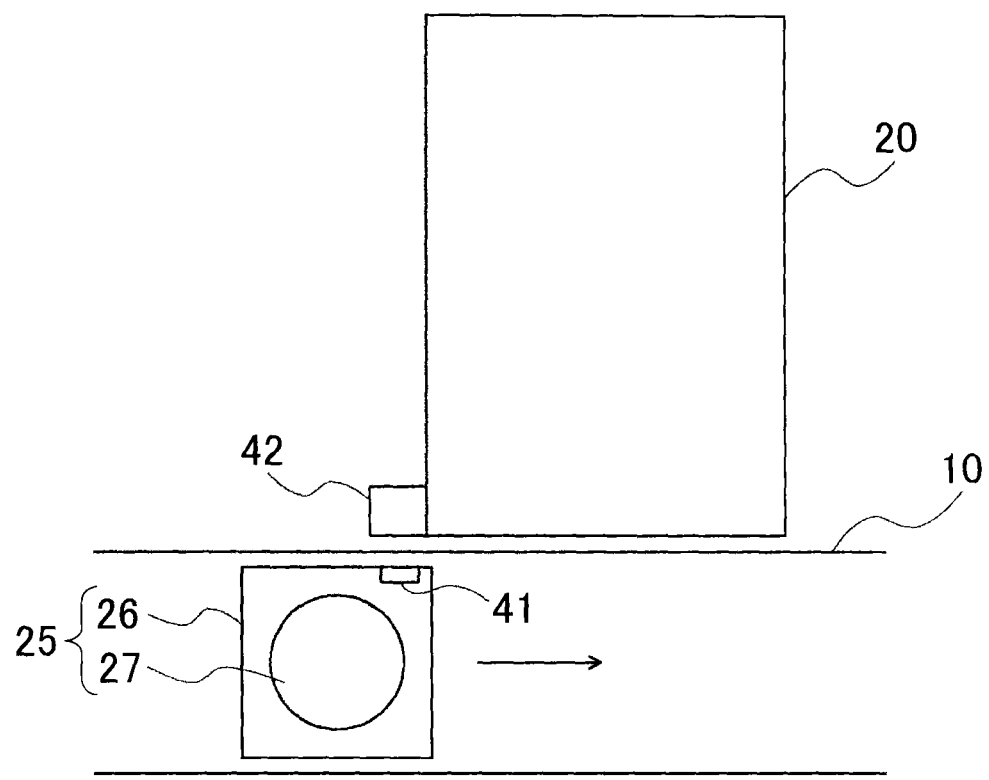
FIG. 2 is a top view for illustrating an example of the configuration of a workpiece.

FIG. 2 is a top view for illustrating an example of the configuration of each of the workpieces 25. As shown in FIG. 2, the workpiece 25 includes a palette 26 and a semiconductor wafer 27. The semiconductor wafer 27 is placed on a placement surface of the palette 26. For example, each palette 26 can convey one semiconductor wafer 27. The palette 26 moves along the conveyance route 10. For example, the conveyance route 10 includes conveyance means (not shown) for conveying the palette 26.

Besides, an information storage device 41 that stores information inherent in the workpiece 25 (ID information, variety information, subsequent process information and the like) is attached to the workpiece 25. For example, a radio frequency identifier (RFID) tag can be used as the information storage device 41. The information in the information storage device 41 to which the workpiece 25 is attached is read and written through the use of a communication device 42. The communication device 42 is provided in the vicinity of the conveyance route 10 in such a manner as to be able to communicate with the workpiece 25 (the information storage device 41) moving along the conveyance route 10 in a non-contact manner with the aid of electric waves.

As shown in FIG. 1, after each of the workpieces 25 is brought onto the conveyance route 10, each of the workpieces 25 is conveyed to a location in front of the treatment devices 20a to 20m corresponding to respective processes. The treatment devices 20a to 20m include manipulators respectively, and fetch the conveyed workpiece 25 through the use of the manipulators. Each of the treatment devices 20a to 20m separates the semiconductor wafer 27 from the palette 26 of the fetched workpiece 25, subjects the separated semiconductor wafer 27 to a predetermined treatment, and places the treated semiconductor wafer 27 again on the palette 26. The treated workpiece 25 is returned onto the conveyance route 10 through the use of the manipulator, and then is conveyed to a location in front of the treatment device that performs a treatment of a subsequent process, along the conveyance route 10. A predetermined semiconductor device is manufactured by repeating such treatments. At this time, the workpiece 25 moves on the routes 11 and 12 of the conveyance route 10 along a direction indicated by arrows 18 and 19.

In the manufacturing line 1 according to the present embodiment of the invention, the treatment devices 20a, 20b, 20f to 20j, 20l, and 20m are arranged on the route 11, and the treatment devices 20c, 20d, 20e, and 20k that are arranged on the route 12, the number of the times of treatment of the treatment devices 20a, 20b, 20f to 20j, 20l, and 20m is larger than the number of the times of treatment of the treatment devices 20c, 20d, 20e, and 20k. In other words, the high-frequency treatment devices that are used with high frequency are arranged on the route 11, and the low-frequency treatment devices that are used with low frequency are arranged on the route 12. It should be noted herein that the number of times of treatment of each of the treatment devices 20a to 20m is the number of times of a treatment to which a specific one of the workpieces 25 is subjected by each of the treatment devices 20a to 20m until the specific one of the workpieces 25 (the workpiece subjected to all the processes) is taken out from the conveyance route 10 through the use of the carry-out device 22 after the specific one of the workpieces 25 (the untreated workpiece) is brought onto the conveyance route 10 through the use of the carry-in device 21.

For instance, each of the low-frequency treatment devices 20c, 20d, 20e, and 20k that are arranged on the route 12 performs a treatment once. Besides, the workpiece 25 is brought in once and taken out once in the process of treating the single workpiece, so the carry-in device 21 and the carry-out device 22 are arranged on the route 12. Incidentally, these configurational examples are nothing more than examples. Each of the treatment devices that are arranged on the route 12 may perform a treatment more than once as long as the number of times of treatment of the treatment devices that are arranged on the route 12 is smaller than the number of times of treatment of the high-frequency treatment devices that are arranged on the route 11. Besides, the carry-in device 21 and the carry-out device 22 may be arranged on the route 11.

Besides, a changeover between the route 11 and the route 12 is made through the use of changeover portions 15 and 16. The changeover portion 15 is configured to be able to change over the conveyance destination of the workpiece 25 that has moved along the route 11 to one of the route 11 and the route 12. Specifically, when the conveyance destination of the workpiece 25 that has moved along the route 11 is the route 11, the changeover portion 15 conveys the workpiece 25 to the coupling route 13 (i.e., in a direction indicated by an arrow 31). Thus, the workpiece 25 moves again along the route 11 in the direction indicated by the arrow 18. Besides, when the conveyance destination of the workpiece 25 that has moved along the route 11 is the route 12, the changeover portion 15 conveys the workpiece 25 to the route 12 (i.e., in a direction indicated by an arrow 32). Thus, the workpiece 25 moves along the route 12 in the direction indicated by the arrow 19. The changeover portion 15 conveys the workpiece 25 to one of the route 11 and the route 12 that includes the treatment device for a subsequent process of the workpiece 25.

By the same token, the changeover portion 16 is configured to be able to change over the conveyance destination of the workpiece 25 that has moved along the route 12 to one of the route 11 and the route 12. Specifically, when the conveyance destination of the workpiece 25 that has moved along the route 12 is the route 11, the changeover portion 16 conveys the workpiece 25 to the route 11 (i.e., in a direction indicated by an arrow 33). Thus, the workpiece 25 moves along the route 11 in the direction indicated by the arrow 18. Besides, when the conveyance destination of the workpiece 25 that has moved along the route 12 is the route 12, the changeover portion 16 conveys the workpiece 25 to the coupling route 13 (i.e., in a direction indicated by an arrow 34). Thus, the workpiece 25 moves along the route 12 in the direction indicated by the arrow 19. The changeover portion 16 conveys the workpiece 25 to one of the route 11 and the route 12 that includes the treatment device for a subsequent process of the workpiece 25.

Incidentally, only the single coupling route 13 is provided in the case shown in FIG. 1. Therefore, when the changeover portion 15 has conveyed the workpiece 25 to the coupling route 13, the changeover portion 16 cannot convey the workpiece 25 to the coupling route 13 until the workpiece 25 conveyed from the changeover portion 15 passes the coupling route 13. By the same token, when the changeover portion 16 has conveyed the workpiece 25 to the coupling route 13, the changeover portion 15 cannot convey the workpiece 25 to the coupling route 13 until the workpiece 25 conveyed from the changeover portion 16 passes the coupling route 13.

Figure 4:
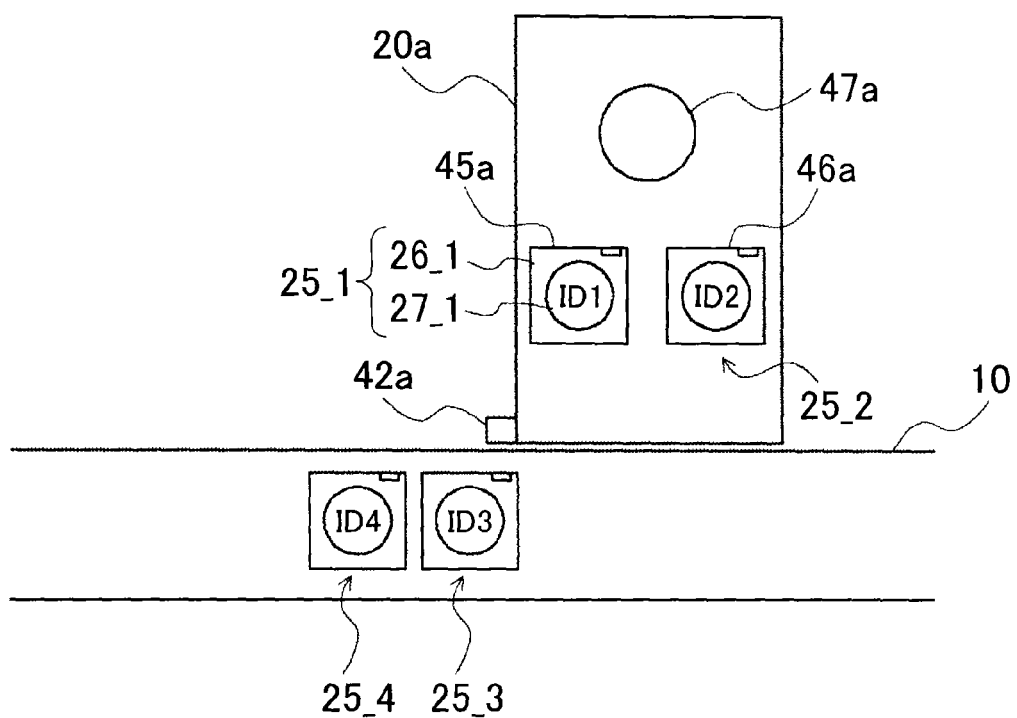
FIG. 4 is a view for illustrating an example of the operation of the manufacturing line according to the embodiment of the invention.
Figure 5:
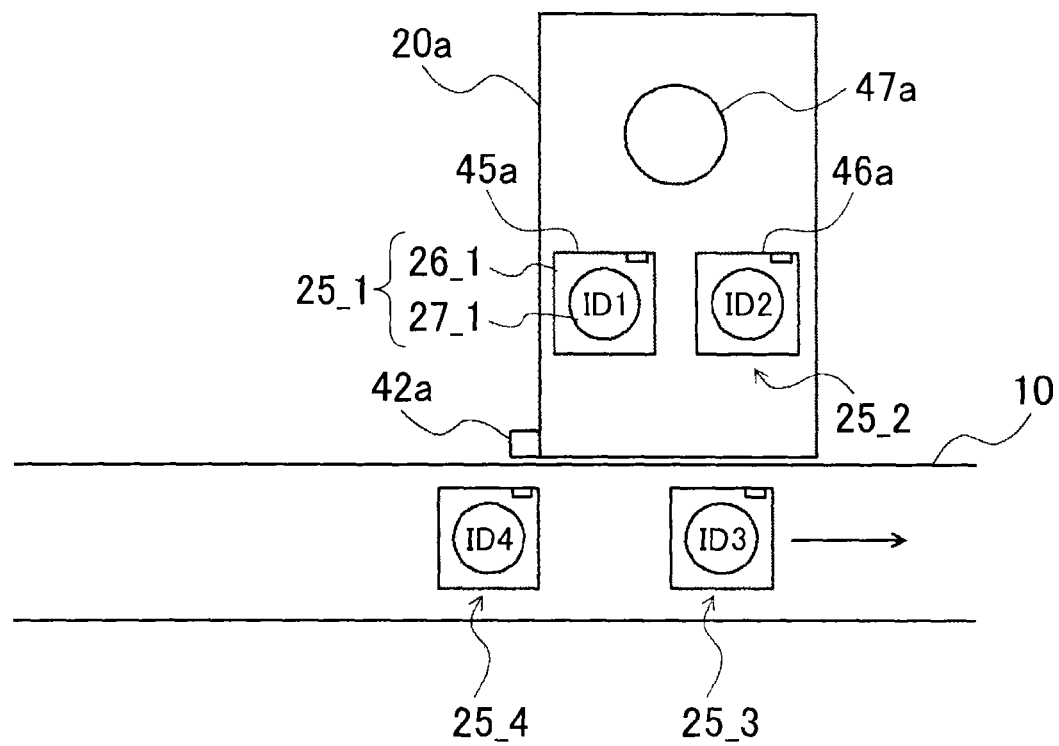
FIG. 5 is a view for illustrating an example of the operation of the manufacturing line according to the embodiment of the invention.

Next, the operation of the manufacturing line 1 according to the present embodiment of the invention will be described. FIGS. 3 to 5 are views for illustrating an example of the operation of the manufacturing line according to the present embodiment of the invention. Hereinafter, the operation of a treatment device A (20a) will be described as an example. However, the same holds true for other treatment devices B to M (20b to 20m).

The treatment device 20a is used in a plurality of processes (e.g., a process 1, a process 9, a process 13, a process 22, and a process 29, see FIG. 8). The treatment device 20a has information of the processes in which the treatment device 20a is used (the process 1, the process 9, the process 13, the process 22, and the process 29) stored in advance in a memory or the like. Hereinafter, an exemplary case where the treatment device 20a subjects each of workpieces 25_1 to 25_4 to the treatment of the process 1 will be described. Each of ID1 to ID4 is stored in the information storage device 41 of a corresponding one of the workpieces 25_1 to 25_4 as ID information. Besides, "the process 1" is stored in the information storage device 41 of each of the workpieces 25_1 to 25_4 as subsequent process information.

As shown in FIG. 3, the treatment device 20a acquires the ID information ("ID1") and the subsequent process information ("the process 1"), which are stored in the information storage device 41 of the workpiece 25_1, through the use of a communication device 42a that is provided at a position corresponding to the treatment device 20a. Since the subsequent process information of the workpiece 25_1 is "the process 1" (i.e., a process for a treatment target of the treatment device 20a), the treatment device 20a fetches the workpiece 25_1 to a standby position 45a of the treatment device 20a through the use of the manipulator. Next, since the subsequent process information of the workpiece 25_2 is "the process 1" (i.e., a process for a treatment target of the treatment device 20a), the treatment device 20a fetches the workpiece 25_2 to a standby position 46a of the treatment device 20a through the use of the manipulator (see FIG. 4).

After that, the treatment device 20a separates a semiconductor wafer 27_1 from a palette 26_1 of the workpiece 25_1 that is placed at the standby position 45a, moves the separated semiconductor wafer 27_1 to a treatment stage 47a, and starts a predetermined treatment. After subjecting the semiconductor wafer 27_1 to the treatment, the treatment device 20a moves the treated semiconductor wafer 27_1 from the treatment stage 47a onto the palette 26_1 that is placed at the standby position 45a. Then, the treatment device 20a writes the subsequent process information (the process 2) into the information storage device 41 of the workpiece 25_1. In other words, after the end of the treatment for the workpiece 25_1, the treatment device 20a writes the subsequent process information (the process 2) into the information storage device 41 before taking out the workpiece 25_1 onto the conveyance route 10. In this manner, the treatment device B (20b) that performs the treatment for the subsequent process (the process 2) can be made to recognize that the workpiece 25_1 is a treatment target, by updating the subsequent process information of the workpiece 25_1 from "the process 1" to "the process 2". The present embodiment of the invention makes it possible to treat the workpieces 25 according to the sequence of the processes in the respective treatment devices 20a to 20m by successively updating the subsequent process information of the workpieces 25.

While subjecting the workpiece 25_1 to the treatment, the treatment device 20a cannot newly fetch the workpiece 25_3 (see FIG. 4). In this case, after acquiring the ID information of the workpiece 25_3 ("ID3") and the subsequent process information ("the process 1") through the use of the communication device 42a, the treatment device 20a registers the ID information ("ID3") on the workpiece 25_3 into "a priority level 1" (which means the highest priority level) of "the process 1" in the table shown in FIG. 6. Then, as shown in FIG. 5, the treatment device 20a causes the workpiece 25_3 to orbit along the route 11 (see FIG. 1) without fetching the workpiece 25_3.

Besides, when the workpiece 25_1 is taken out onto the conveyance route 10 after being treated by the treatment device 20a, the standby position 45a of the treatment device 20a assumes an accessible state. However, the workpiece 25_3 is registered in "the priority level 1" of the table shown in FIG. 6. Therefore, as shown in FIG. 5, the treatment device 20a does not fetch the workpiece 25_4 even when the workpiece 25_4 has been conveyed. That is, after acquiring the ID information ("ID4") on the workpiece 25_4 and the subsequent process information ("the process 1") on the workpiece 25_4 through the use of the communication device 42a, the treatment device 20a registers the ID information ("ID4") on the workpiece 25_4 into "a priority level 2" (which means the second highest priority level) of "the process 1" in the table shown in FIG. 7. Then, the treatment device 20a causes the workpiece 25_4 to orbit along the route 11. At this time, according to the priority sequence of the workpieces treated by the treatment device 20a, the workpiece 25_4 follows the workpiece 25_3. Therefore, the treatment device 20a fetches the workpiece 25_3 that has orbited, with higher priority than the other workpieces.

That is, when the workpieces are registered in "the priority level 1" and "the priority level 2" of the table, the treatment device 20a fetches the workpieces according to these priority levels. Besides, when no workpiece is registered in "the priority level 1" and "the priority level 2" of the table and the standby positions 45a and 46a of the treatment device 20a are unoccupied, the treatment device 20a fetches the workpieces according to the sequence in which they are conveyed thereto. Incidentally, as shown in FIGS. 6 and 7, "the priority level 1" and "the priority level 2", which represent the degrees of priority, are provided for each of the processes of the treatment device 20a (i.e., the process 1, the process 9, the process 13, the process 22, and the process 29). Besides, the tables shown in FIGS. 6 and 7 cite an example in which the two priority levels 1 and 2 are provided. However, the number of priority levels for registration may be three or more. Besides, for example, when the workpieces are registered into "the priority level 1" and "the priority level 2" of the table and then lot out in mid-course, the lot-out workpieces are deleted from "the priority level 1" and "the priority level 2" of the table. Thus, the treatment device 20a can be prevented from keeping waiting for the lot-out workpieces.

Next, a case where the changeover portion 15 changes over the conveyance destination of the workpiece 25 that has moved along the route 11 to one of the route 11 and the route 12 will be described. Route information that associates the respective processes with the route (the route 11 or the route 12), on which the treatment devices 20a to 20m that perform treatments in the respective processes are arranged, is stored in advance in the changeover portion 15. This route information does not change unless the arrangement of the respective treatment devices 20a to 20m changes. The changeover portion 15 acquires subsequent process information of the workpiece 25 with the aid of the communication device 42 that is provided at a position corresponding to the changeover portion 15, and determines the route corresponding to the subsequent process information (i.e., the route on which the treatment device that performs the treatment for the subsequent process is arranged) with reference to the route information. The changeover portion 15 conveys the workpiece 25 to the route thus determined. The procedure for the changeover portion 15 is the same as the procedure for the changeover portion 16.

Incidentally, the operation described above is nothing more than an example. In the present embodiment of the invention, the manufacturing line 1 may be controlled using other methods.

Next, a concrete treatment example of the workpiece 25 on the manufacturing line according to the present embodiment of the invention will be described using FIGS. 1 and 8. FIG. 8 shows an example of treatment processes of the workpiece 25. A predetermined semiconductor device is formed by sequentially subjecting the workpiece 25 to the treatments of processes 1 to 32. In the example shown in FIG. 8, each of the treatment devices C, D, E and K that are arranged on the route 12 performs a treatment once (i.e., performs a treatment once in each of the processes 1 to 32).

In forming the semiconductor device, the carry-in device 21 brings the workpiece 25 (the untreated workpiece) onto the conveyance route 10. After that, the workpiece 25 is conveyed to the route 11 (i.e., in the direction indicated by the arrow 33) at the changeover portion 16. The workpiece 25 is sequentially treated by the treatment device A (in the process 1), the treatment device B (in the process 2), the treatment device F (in the process 3), the treatment device G (in the process 4), the treatment device H (in the process 5), the treatment device I (in the process 6), the treatment device L (in the process 7), and the treatment device M (in the process 8), which are arranged on the route 11 respectively.

The treatment of the subsequent process 9 is performed by the treatment device A. Therefore, the changeover portion 15 sets the conveyance destination of the workpiece 25 that has moved along the route 11 as the coupling route 13 (i.e., in the direction indicated by the arrow 31), and conveys the workpiece 25 again to the route 11. After that, the workpiece 25 is sequentially treated by the treatment device A (in the process 9), the treatment device B (in the process 10), the treatment device J (in the process 11), and the treatment device M (in the process 12), which are arranged on the route 11 respectively.

The treatment of the subsequent process 13 is performed by the treatment device A. Therefore, the changeover portion 15 sets the conveyance destination of the workpiece 25 that has moved along the route 11 as the coupling route 13 (i.e., in the direction indicated by the arrow 31), and conveys the workpiece 25 again to the route 11. After that, the workpiece 25 is treated by the treatment device A (in the process 13).

The treatment of the subsequent process 14 is performed by the treatment device E, so the changeover portion 15 conveys the workpiece 25 that has moved along the route 11 to the route 12 (i.e., in the direction indicated by the arrow 32). After that, the workpiece 25 is treated by the treatment device E (in the process 14). The treatment of the subsequent process 15 is performed by the treatment device J, so the changeover portion 16 conveys the workpiece 25 that has moved along the route 12 to the route 11 (i.e., in the direction indicated by the arrow 33). After that, the workpiece 25 is treated by the treatment device J (in the process 15).

The treatment of the subsequent process 16 is performed by the treatment device F, so the changeover portion 15 sets the conveyance destination of the workpiece 25 that has moved along the route 11 as the coupling route 13 (i.e., in the direction indicated by the arrow 31), and conveys the workpiece 25 to the route 11. After that, the workpiece 25 is sequentially treated by the treatment device F (in the process 16), the treatment device G (in the process 17), and the treatment device H (in the process 18), which are arranged on the route 11 respectively. The treatment of the subsequent process 19 is performed by the treatment device K, so the changeover portion 15 conveys the workpiece 25 that has moved along the route 11 to the route 12 (i.e., in the direction indicated by the arrow 32). After that, the workpiece 25 is treated by the treatment device K (in the process 19). The workpiece 25 is thereafter treated in a similar manner in the processes 20 to 32 as well. Then, after the end of the process 32, the workpiece 25 is taken out from the conveyance route 10 through the use of the carry-out device 22.

As described in the background art, according to the art disclosed in Japanese Patent Application Publication No. 2012-104683 (JP 2012-104683 A), the semiconductor device is manufactured by arranging the treatment device on the loop-like conveyance route and causing the workpieces to orbit along this loop-like conveyance route. In consequence, the treatment devices that are arranged on the manufacturing line can be commonly used in different processes, so the length of the manufacturing line can be shortened.

However, with the manufacturing line disclosed in Japanese Patent Application Publication No. 2012-104683 (JP 2012-104683 A), the treatment devices are not aligned in such a manner as to correspond to the sequence of the processes for the semiconductor device, so the treatment device that performs the subsequent process is spaced apart from the treatment device that performs the current process in some cases. In these cases, while the workpiece is conveyed to the treatment device that performs the process of the subsequent process, the workpiece passes in front of the unused treatment device, so there is a possibility of the conveyance distance of the workpiece being lengthened. For example, when the treatment device that performs the treatment of the subsequent process is adjacent to the other side in the conveyance direction of the workpiece, the workpiece needs to be conveyed by about one turn along the manufacturing line, in order to convey the workpiece to the treatment device that performs the treatment of the subsequent process.

Thus, with the manufacturing line 1 for the semiconductor device according to the present embodiment of the invention, among the plurality of the treatment devices 20a to 20m, the treatment devices with a large number of times of treatment (the high-frequency treatment devices) are arranged on the route 11, and the treatment devices with a small number of times of treatment (the low-frequency treatment devices) are arranged on the route 12. Then, the changeover portion 15 makes a changeover between the conveyance of the workpiece 25 that has moved along the route 11 to the route 11 in a continuous manner and the conveyance of the workpiece 25 that has moved along the route 11 to the route 12. In consequence, the workpiece 25 can be conveyed to the route 12 only when it is treated by the low-frequency treatment devices. Otherwise, the workpiece 25 can be conveyed to the route 11 on which the high-frequency treatment devices are arranged. Therefore, the number of times by which the workpiece 25 passes in front of the low-frequency treatment devices can be made small, so the conveyance distance of the workpiece 25 on the manufacturing line 1 can be shortened.

For example, in the case where the manufacturing line 1 shown in FIG. 1 does not include the coupling route 13, the workpiece 25 needs to pass the route including the treatment devices C to M and to be conveyed by about one turn along the conveyance route 10, in order to be treated by the treatment device A after being treated by the treatment device B.

On the other hand, in the case where the manufacturing line 1 includes the coupling route 13, the changeover portion 15 can set the conveyance destination of the workpiece 25 as the coupling route 13 (i.e., in the direction indicated by the arrow 31) after the workpiece 25 has passed the treatment device M, in order to ensure that the workpiece 25 is treated by the treatment device A after being treated by the treatment device B. Thus, the route on which the workpiece 25 is conveyed to the treatment device A can be shortened. That is, the workpiece 25 is conveyed to the treatment device A through the coupling route 13 as a shortcut instead of passing the route 12, so the distance to the treatment device A can be shortened.

At this time, with the manufacturing line 1 according to the present embodiment of the invention, the conveyance route 10 is divided into the route 11 on which the high-frequency treatment devices are arranged and the route 12 on which the low-frequency treatment devices are arranged, and the workpieces 25 are circulated in a concentrated manner on the route 11 on which the high-frequency treatment devices are arranged. Therefore, the total conveyance distance of the workpieces 25 on the manufacturing line 1 can be shortened.

Besides, with the manufacturing line disclosed in Japanese Patent Application Publication No. 2012-104683 (JP 2012-104683 A), when the treatment device that performs the treatment of the subsequent process is in use, the workpiece cannot be carried into the treatment device, so the workpiece needs to be caused to orbit along the conveyance route. In this case, the conveyance distance of the workpiece may become long when the conveyance route is long. Besides, when the treatment device that performs the treatment of the subsequent process is in use, it is also conceivable to shorten the conveyance distance of the workpiece by providing the conveyance route with a standby portion instead of causing the workpiece to orbit along the conveyance route. In this case, however, the standby portion needs to be provided with carry-in means for bringing the workpiece and control means, and the cost of the manufacturing line may increase.

In contrast, with the manufacturing line 1 for the semiconductor device according to the present embodiment of the invention, the high-frequency treatment devices are arranged on the route 11, and the low-frequency treatment devices are arranged on the route 12. The changeover portion 15 changes over the conveyance destination of the workpiece 25 that has moved along the route 11 to one of the route 11 and the route 12. In consequence, even in the case where the workpiece is caused to orbit along the conveyance route, the conveyance distance of the workpiece can be shortened. Besides, there is no need to newly provide a standby portion either, so the cost of the manufacturing line can be restrained from increasing.

Besides, the production system for semiconductor devices has adopted a mass-production system in which a lot mounted with a plurality of semiconductor wafers is caused to flow to a manufacturing line and is then processed in bulk. This production system has possibilities that the production lead time is long, that production fluctuations cannot be swiftly followed, and the like. In contrast, the manufacturing line 1 according to the present embodiment of the invention adopts a system in which semiconductor wafers are conveyed and processed one by one through the use of the workpieces 25. Therefore, a necessary quantity of semiconductor devices can be produced when necessary.

Incidentally, the manufacturing line 1 shown in FIG. 1 has been described as to the configuration equipped with the changeover portions 15 and 16. However, the manufacturing line 1 according to the present embodiment of the invention may include at least the changeover portion 15, and the changeover portion 16 is not an indispensable component. That is, the route 12 is a route on which the low-frequency treatment devices are arranged. Therefore, the changeover portion 16 seldom sets the conveyance destination of the workpiece 25 as the coupling route 13 (i.e., in the direction indicated by the arrow 34). Consequently, in most cases, the changeover portion 16 sets the conveyance destination of the workpiece 25 as the route 11 (i.e., in the direction indicated by the arrow 33), so the changeover portion 16 can be omitted.

Next, a modification example of the manufacturing line according to the present embodiment of the invention will be described. The manufacturing line 1 shown in FIG. 1 has been described as to the configuration in which the loop-like route 11 and the loop-like route 12 partially share the coupling route 13. However, in the present embodiment of the invention, a manufacturing line 2 shown in FIG. 9 may be configured such that the loop-like route 11 and the loop-like route 12 are partially adjacent to each other, namely, that a coupling route 51 and a coupling route 52 are adjacent to each other.

Figure 9:
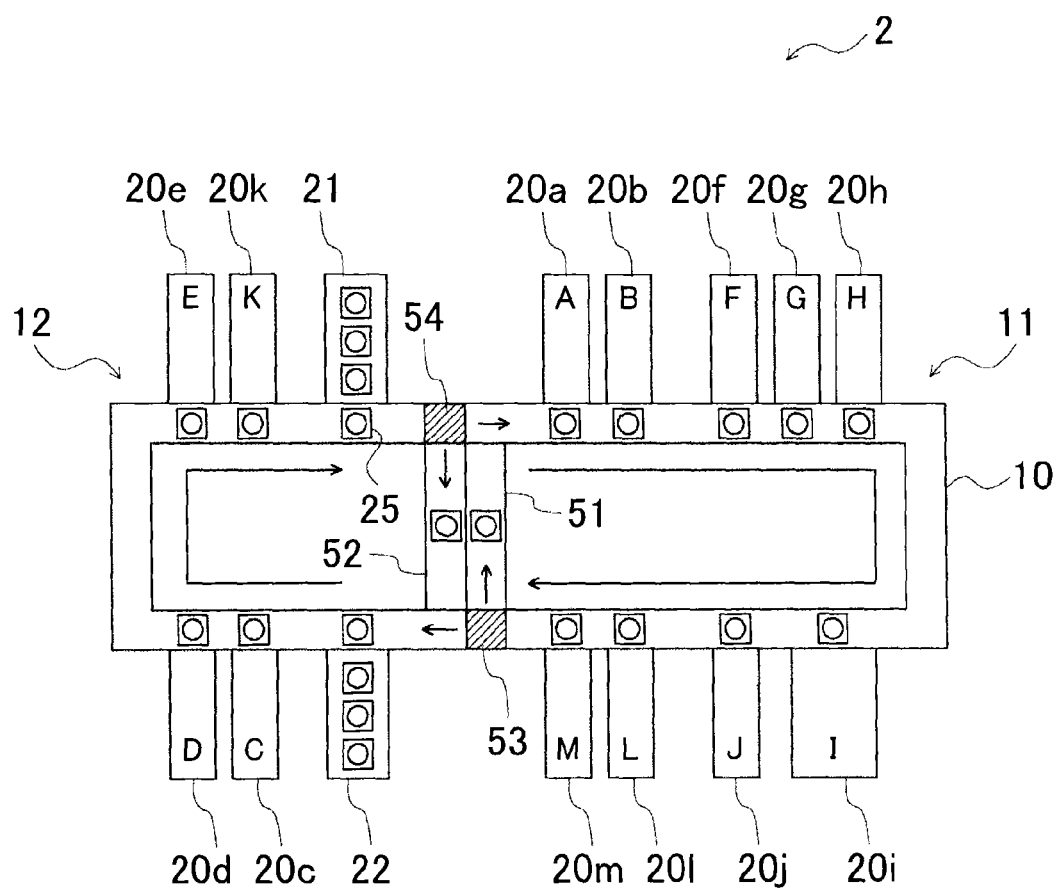
FIG. 9 is a top view showing another configuration example of the manufacturing line according to the embodiment of the invention.

With the manufacturing line 2 shown in FIG. 9, when the conveyance destination of the workpiece 25 that has moved along the route 11 is set as the route 11, the changeover portion 53 conveys the workpiece 25 to the coupling route 51. Besides, when the conveyance destination of the workpiece 25 that has moved along the route 11 is set as the route 12, the changeover portion 53 conveys the workpiece 25 to the route 12. Besides, when the conveyance destination of the workpiece 25 that has moved along the route 12 is set as the route 12, the changeover portion 54 conveys the workpiece 25 to the coupling route 52. Besides, when the conveyance destination of the workpiece 25 that has moved along the route 12 is set as the route 11, the changeover portion 54 conveys the workpiece 25 to the route 11.

The manufacturing line 1 shown in FIG. 1 includes the single coupling route 13. Therefore, only one of the changeover portion 15 and the changeover portion 16 can convey the workpiece 25 to the coupling route 13. However, with the manufacturing line 2 shown in FIG. 9, the changeover portion 53 and the changeover portion 54 can simultaneously convey the workpiece 25 to the coupling routes 51 and 52. Therefore, there is no need to temporarily stop conveying the workpiece 25.

Figure 10:
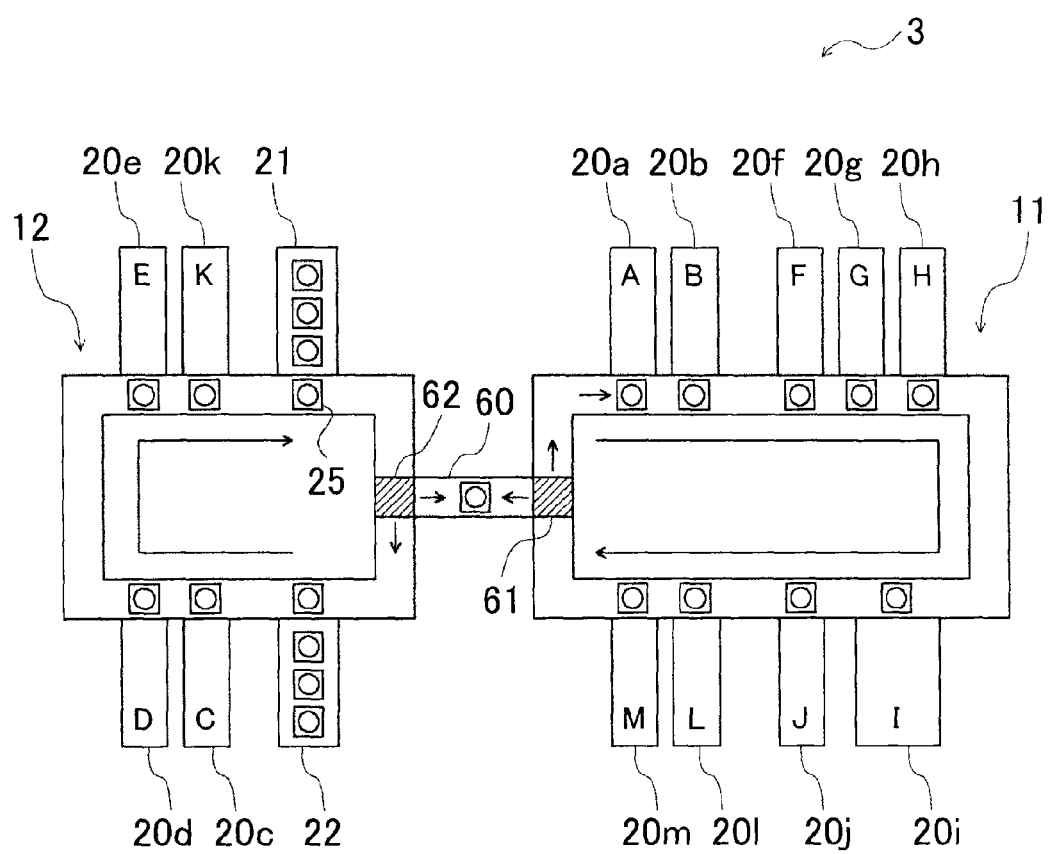
FIG. 10 is a top view showing still another configuration example of the manufacturing line according to the embodiment of the invention.

Besides, according to the present embodiment of the invention, the route 11 and the route 12 may be configured to be independent of each other, and the route 11 and the route 12 may be coupled to each other through the use of a coupling route 60, as is the case with a manufacturing line 3 shown in FIG. 10.

With the manufacturing line 3 shown in FIG. 10, when the conveyance destination of the workpiece 25 that has moved along the route 11 is set as the route 12, a changeover portion 61 conveys the workpiece 25 to the coupling route 60. Besides, when the conveyance destination of the workpiece 25 that has moved along the route 12 is set as the route 11, a changeover portion 62 conveys the workpiece 25 to the coupling route 60.

Figure 11:
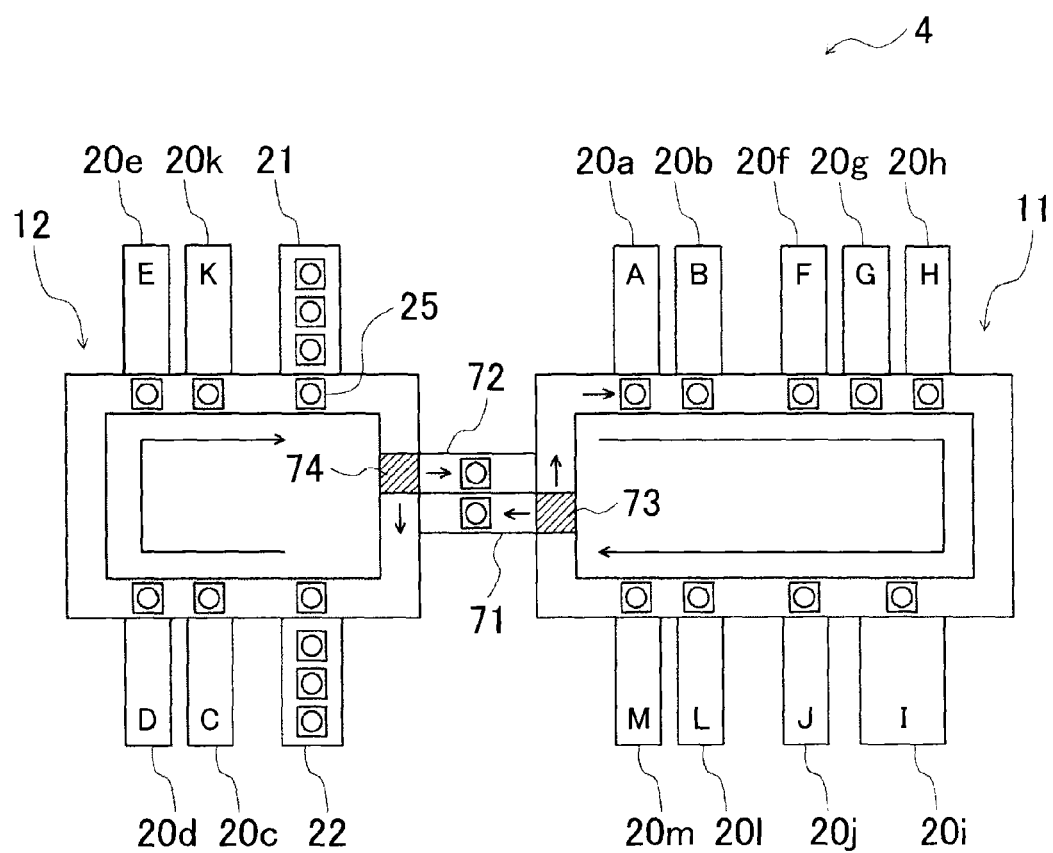
FIG. 11 is a top view showing still another configuration example of the manufacturing line according to the embodiment of the invention.

Besides, in the present embodiment of the invention, the route 11 and the route 12 may be configured to be independent of each other, and the route 11 and the route 12 may be coupled to each other through the use of coupling routes 71 and 72, as is the case with a manufacturing line 4 shown in FIG. 11.

With the manufacturing line 4 shown in FIG. 11, when the conveyance destination of the workpiece 25 that has moved along the route 11 is set as the route 12, a changeover portion 73 conveys the workpiece 25 to the coupling route 71. Besides, when the conveyance destination of the workpiece 25 that has moved along the route 12 is set as the route 11, a changeover portion 74 conveys the workpiece 25 to the coupling route 72.

The manufacturing line 3 shown in FIG. 10 is provided with only the single coupling route 60, so only one of the changeover portion 61 and the changeover portion 62 can convey the workpiece 25 to the coupling route 60. However, with the manufacturing line 4 shown in FIG. 11, the changeover portion 73 and the changeover portion 74 can simultaneously convey the workpiece 25 to the coupling routes 71 and 72, so there is no need to temporarily stop conveying the workpiece 25.

Besides, the manufacturing line according to the present embodiment of the invention, which has been described above, has been described as to the case where the conveyance route 10 includes the two routes 11 and 12. However, the manufacturing line according to the present embodiment of the invention may be configured such that the conveyance route includes three or more routes. For example, there may be adopted a configuration in which a conveyance route 80 includes three routes 81, 82, and 83, as is the case with a manufacturing line 5 shown in FIG. 12.

In this case, treatment devices are arranged on the route 82 (the treatment devices are not shown in FIG. 12) and treatment devices are arranged on the route 81, and the number of times of treatment of treatment devices are arranged on the route 82 is larger than the number of times of treatment of treatment devices that are arranged on the route 81. Treatment devices are arranged on the route 83 and the number of times of treatment of treatment devices are arranged on the route 83 is larger than the number of times of treatment of the treatment devices that are arranged on the route 82. In other words, the low-frequency treatment devices are arranged on the route 81, the intermediate-frequency treatment devices are arranged on the route 82, and the high-frequency treatment devices are arranged on the route 83. Besides, the route 83 is arranged opposite the route 81 with respect to the route 82. Incidentally, the configuration of changeover portions 84, 85, 86, and 87 is the same as in the case of the manufacturing line 1 shown in FIG. 1, so redundant description will be omitted.

Figure 12:
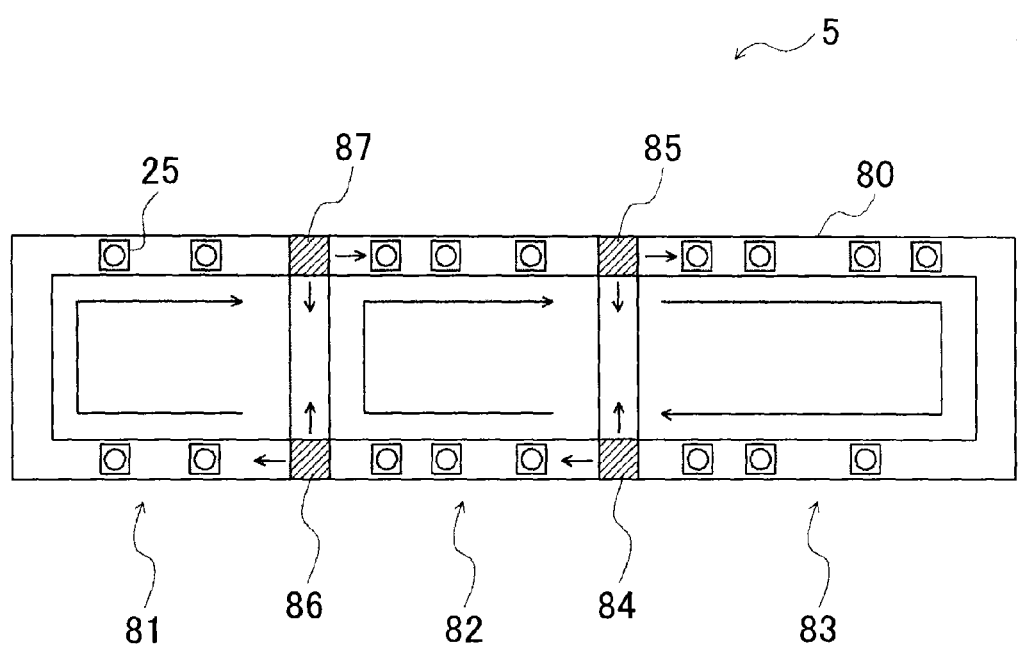
FIG. 12 is a top view showing still another configuration example of the manufacturing line according to the embodiment of the invention.

Besides, the manufacturing line 5 shown in FIG. 12 may also be provided with a pair of coupling routes as is the case with the manufacturing line 2 shown in FIG. 9. Besides, the respective routes 11 and 12 may be configured to be independent of each other as is the case with the manufacturing lines 3 and 4 shown in FIGS. 10 and 11.

Besides, when a semiconductor device is manufactured, each manufacturing process can be classified into a plurality of process groups. The manufacturing line according to the present embodiment of the invention can be applied to each of these process groups. For example, a process of manufacturing a semiconductor power device such as an insulated gate bipolar transistor (an IGBT) or the like can be classified into three process groups, namely, a diffusion layer formation process group, a gate insulating film formation process group, and an electrode formation process group, in consideration of the accuracy of photolithography. In this case, the semiconductor device can be manufactured using three manufacturing lines, namely, a manufacturing line of the diffusion layer formation process group, a manufacturing line of the gate insulating film formation process group, and a manufacturing line of the electrode formation process group.

Besides, with the manufacturing line according to the present embodiment of the invention, the semiconductor device is formed by causing the workpieces to orbit (circulating the workpieces) along the same manufacturing line. Therefore, the cycle time of the manufacturing line is equal to a value obtained by dividing the total processing time on the manufacturing line by the number of times of orbiting. In the present embodiment of the invention, the process of manufacturing the semiconductor device may be classified into the respective process groups in consideration of this cycle time.

The invention has been described above referring to the aforementioned embodiment thereof. However, the invention should not be limited only to the configuration of the aforementioned embodiment thereof. As a matter of course, the invention includes various modifications, alterations, and combinations that could be achieved by those skilled in the art within the scope of the invention as stated in the claims of the present application.

What is claimed is:

1. A manufacturing line for a semiconductor device, comprising:
   a conveyance route on which a plurality of treatment devices are arranged, wherein
   a workpiece is circulated along the conveyance route on which the plurality of the treatment devices are arranged,
   the conveyance route includes a first route on which a plurality of the treatment devices that subject the workpiece to predetermined treatments are arranged, and a second route on which a plurality of the treatment devices are arranged, a number of times of treatment of the treatment devices that are arranged on the second route being larger than a number of times of treatment of the treatment devices that are arranged on the first route, and
   the conveyance route includes at least two changeover devices, at least one of the changeover devices to take the workpiece that has moved along the second route acid allow that same workpiece to repeat moving along the second route, and at least one of the changeover devices to take the workpiece that has moved along the second route and move that same workpiece to the first route.

2. The manufacturing line for the semiconductor device according to claim 1, wherein
   the conveyance route changes over a conveyance destination of the workpiece that has moved along the first route to one of the first route and the second route.

3. The manufacturing line for the semiconductor device according to claim 1, wherein
   an information storage device that stores information inherent in the workpiece is attached to the workpiece, and
   the conveyance route changes over a conveyance destination of the workpiece to one of the first route and the second route, based on the information inherent in the workpiece that is stored in the information storage device.

4. The manufacturing line for the semiconductor device according to claim 1, wherein
   the conveyance route selects one of the first route and the second route that includes a treatment device for a subsequent process of the workpiece, as a conveyance destination of the workpiece.

5. The manufacturing line for the semiconductor device according to claim 1, wherein
   each of the treatment devices arranged on the first route subjects the workpiece to the treatment once until the workpiece is taken out from the conveyance route after being brought onto the conveyance route.

6. The manufacturing line for the semiconductor device according to claim 1, wherein
   a carry-in device that brings the workpiece onto the conveyance route, and a carry-out device that takes the workpiece out from the conveyance route are arranged on the first route.

7. The manufacturing line for the semiconductor device according to claim 1, wherein
   the first route and the second route are independent of each other, and
   the first route and the second route are coupled to each other through a coupling route.

8. The manufacturing line for the semiconductor device according to claim 1, wherein
   a treatment device subjects the workpiece to a treatment when subsequent process information stored in an information storage device of the workpiece is information corresponding to a process for a treatment target of the treatment devices, and updates the subsequent process information of the workpiece after the treatment of the workpiece ends.

9. The manufacturing line for the semiconductor device according to claim 8, wherein
   while subjecting the workpiece to the treatment, the treatment device acquires ID information and subsequent process information of a different workpiece, registers the ID information of the different workpiece into a table in which priority levels are stored, and causes the different workpiece to orbit along the conveyance route, and
   the treatment device takes in the different workpiece in accordance with the priority levels registered in the table, after the treatment of the workpiece ends.

10. The manufacturing line for the semiconductor device according to claim 1, wherein
    the conveyance route includes a third route on which a plurality of the treatment devices with a larger number of times of treatment than that of the treatment devices that are arranged on the second route are arranged,
    the third route is arranged opposite the first route with respect to the second route, and the conveyance route makes a changeover between conveyance of the workpiece that has moved along the third route to the third route in a continuous manner and conveyance of the workpiece that has moved along the third route to the second route.

11. The manufacturing line for the semiconductor device according to claim 1, wherein the conveyance route makes a changeover between conveyance of the workpiece that has moved along and passed all of the treatment devices arranged on the second route to the second route in a continuous manner and conveyance of the workpiece that has moved along the second route to the first route.

12. A method of manufacturing a semiconductor device in which the semiconductor device is manufactured by circulating a workpiece along a conveyance route on which a plurality of treatment devices are arranged, wherein the conveyance route includes a first route on which a plurality of the treatment devices that subject the workpiece to predetermined treatments are arranged, and a second route on which a plurality of the treatment devices are arranged, a number of times of treatment of the treatment devices that are arranged on the second route being larger than a number of times of treatment of the treatment devices that are arranged on the first route, and the conveyance route includes at least two changeover devices, the method comprising:
making a changeover between,
taking the workpiece that has moved along the second route and allowing that same workpiece to repeat moving along the second route with at least one of the changeover devices, and
taking the workpiece that has moved along the second route and moving that same workpiece to the first route with at least one of the changeover devices.

13. The method of manufacturing the semiconductor device according to claim 12, wherein the making the changeover includes making a changeover between conveyance of the workpiece that has moved along and passed all of the treatment devices arranged on the second route to the second route in a continuous manner and conveyance of the workpiece that has moved along the second route to the first route.

* * * * *